(12) United States Patent
Jeong

(10) Patent No.: US 8,362,498 B2
(45) Date of Patent: Jan. 29, 2013

(54) LIGHT EMITTING DEVICE ARRAY, METHOD FOR FABRICATING LIGHT EMITTING DEVICE ARRAY AND LIGHT EMITTING DEVICE

(75) Inventor: Joo Yong Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/102,610

(22) Filed: May 6, 2011

(65) Prior Publication Data

US 2011/0284880 A1    Nov. 24, 2011

(30) Foreign Application Priority Data

May 24, 2010   (KR) .................. 10-2010-0048058

(51) Int. Cl.
*H01L 33/00* (2010.01)
(52) U.S. Cl. ........ 257/88; 257/98; 257/99; 257/E33.005
(58) Field of Classification Search .................... 257/88, 257/98–100, E33.005, E33.059
See application file for complete search history.

(56) References Cited

U.S. PATENT DOCUMENTS

| | | | | |
|---|---|---|---|---|
| 7,211,833 | B2 * | 5/2007 | Slater et al. ...................... | 257/98 |
| 8,003,994 | B2 * | 8/2011 | Liu et al. .......................... | 257/79 |
| 2005/0194603 | A1 * | 9/2005 | Slater et al. ...................... | 257/98 |
| 2005/0199891 | A1 | 9/2005 | Kunisato et al. ................. | 257/85 |
| 2006/0226434 | A1 | 10/2006 | Hata ................................ | 257/94 |
| 2006/0231944 | A1 * | 10/2006 | Huang et al. ................... | 257/706 |
| 2007/0077673 | A1 | 4/2007 | Hwang et al. ................... | 438/46 |
| 2007/0228404 | A1 | 10/2007 | Tran et al. ....................... | 257/98 |
| 2010/0078656 | A1 | 4/2010 | Seo et al. ......................... | 257/88 |
| 2010/0201254 | A1 * | 8/2010 | Matsumura .................... | 313/501 |
| 2011/0233583 | A1 * | 9/2011 | Lin et al. .......................... | 257/98 |

FOREIGN PATENT DOCUMENTS

| | | |
|---|---|---|
| DE | 196 25 622 A1 | 1/1998 |
| DE | 10 2005 053 274 A1 | 4/2007 |
| JP | 2006-319311 | 11/2006 |
| JP | 2008-263015 A | 10/2008 |
| JP | 2010-067818 | 3/2010 |
| KR | 10-2007-0120424 A | 12/2007 |
| KR | 10-2009-0001107 A | 1/2009 |
| KR | 10-2010-0020494 A | 2/2010 |
| KR | 10-2010-0036758 A | 4/2010 |
| WO | WO 2006/104935 A2 | 10/2006 |

OTHER PUBLICATIONS

Japanese Office Action for Application 2011-084703 dated Nov. 6, 2012.

* cited by examiner

*Primary Examiner* — Tuan N. Quach
(74) *Attorney, Agent, or Firm* — KED & Associates, LLP

(57) ABSTRACT

A light emitting device array includes a first supporting member, at least two bonding layers disposed on the first supporting member, a second supporting member disposed on each of the at least two bonding layers, a light emitting structure disposed on the second supporting member, the light emitting structure comprising a first conductivity type semiconductor layer, a second conductivity type semiconductor layer and an active layer disposed between the first conductivity type semiconductor layer and the second conductivity type semiconductor layer, and a first electrode disposed on the light emitting structure.

19 Claims, 13 Drawing Sheets laser

LIGHT EMITTING DEVICE ARRAY, METHOD FOR FABRICATING LIGHT EMITTING DEVICE ARRAY AND LIGHT EMITTING DEVICE

CROSS REFERENCE TO RELATED APPLICATION

This application claims the benefit of the Patent Korean Application No. 10-2010-0048058, filed on May 24, 2010, which is hereby incorporated by reference as if fully set forth herein.

BACKGROUND OF THE DISCLOSURE

1. Field of the Disclosure

The embodiment relates to a light emitting device array, a method for fabricating the light emitting device array and a light emitting device array package.

2. Discussion of the Related Art

Owing to development of thin film growth and thin film device elements, a light emitting device including a light emitting diode and a laser diode, which use 3-5 group or 2-6 group compound semiconductor elements of a semiconductor, can present a variety of colors, for example, red, green and blue colors and an infrared ray. Fluorescence material usage or color combination allows the light emitting device to present a white light having good light efficiency. Compared with a conventional light source such as a fluorescent lamp and an incandescent lamp, such the light emitting device has several advantages of low power consumption, semipermanent usage, fast response speed, safety and environment-friendliness.

The light emitting device has been applied to a transmission module of light communication means, a light emitting diode backlight replacing a cold cathode fluorescence lamp (CCFL) composing a backlight of a liquid crystal display (LCD) device, a white light emitting diode lightening device replacing a fluorescent lamp and an incandescent lamp, a headlight of a vehicle and even to a traffic light broadly.

SUMMARY OF THE DISCLOSURE

Accordingly, the embodiment is directed to a light emitting device array, a method for fabricating the light emitting device array and a light emitting device package.

An object of the embodiment is to enable a die/wire bonding process of a light emitting device to be performed smoothly and efficiently.

Additional advantages, objects, and features of the disclosure will be set forth in part in the description which follows and in part will become apparent to those having ordinary skill in the art upon examination of the following or may be learned from practice of the embodiment. The objectives and other advantages of the embodiment may be realized and attained by the structure particularly pointed out in the written description and claims hereof as well as the appended drawings. To achieve these objects and other advantages and in accordance with the purpose of the embodiment, as embodied and broadly described herein, a light emitting device array includes a first supporting member; at least two bonding layers disposed on the first supporting member; a second supporting member disposed on each of the at least two bonding layers; a light emitting structure disposed on the second supporting member, the light emitting structure comprising a first conductivity type semiconductor layer, a second conductivity type semiconductor layer and an active layer disposed between the first conductivity type semiconductor layer and the second conductivity type semiconductor layer; and a first electrode disposed on the light emitting structure.

An edge of the bonding layer may be located 1~10 micrometers inner than an edge of the light emitting structure.

The bonding layer may include concave-convex structure formed on a surface of the first supporting member.

A second supporting member of a light emitting device may be connected with a second supporting member of a neighboring light emitting device via a metal layer.

At least a predetermined part of composition of the metal layer may be same as composition of the second supporting member.

at least predetermined part of composition of the metal layer may be same as composition of the bonding layer.

at least predetermined part of composition of the metal layer may be same as composition of the light emitting structure.

The light emitting device array may further include an ohmic layer disposed between the second conductivity type semiconductor layer and the second supporting member.

The light emitting device array may further include a reflective layer disposed between the ohmic layer and the second supporting member.

The light emitting device array may further include an adhesion layer disposed between the ohmic layer and the second supporting member.

The second supporting member may be a conductivity supporting substrate and the conductivity supporting substrate comprises at least one of a selected material from a group consisting of Mo, Si, W, Cu and Al or an alloy of the group, Au, Cu alloy, Ni-nickel, Cu—W and carrier wafer.

The ohmic layer may include at least one selected from a group consisting of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf.

The reflective layer may include at least one of an alloy of Al, Ag, Pt and Rh, Al, Ag, Ni, Pt and Rh.

The adhesion layer may include at lest one selected from a group consisting of Au, Sn, In, Al, Si, Ag, Ni and Cu or an alloy of the group.

The first supporting member may include one of PVC, PAT and PPT.

The first supporting member may further include epoxy resin.

In another aspect of the embodiment, a light emitting device package includes a package body; a light emitting device disposed on the package body, the light emitting device comprising at least one bonding layer, a conductivity supporting substrate disposed on the at least one bonding layer and a light emitting structure disposed on the at least one conductivity supporting substrate, the light emitting structure comprising a second conductivity type semiconductor layer, an active layer and a first conductivity type semiconductor layer; first and second electrodes disposed on the package body, the first and second electrodes connected with the light emitting device; a filling material configured to surround the light emitting device.

According to the light emitting device, the method for fabricating the same and a light emitting device package, a device property and fabrication efficiency may be improved.

It is to be understood that both the foregoing general description and the following detailed description of the embodiment are exemplary and explanatory and are intended to provide further explanation of the embodiment as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Figure 1:
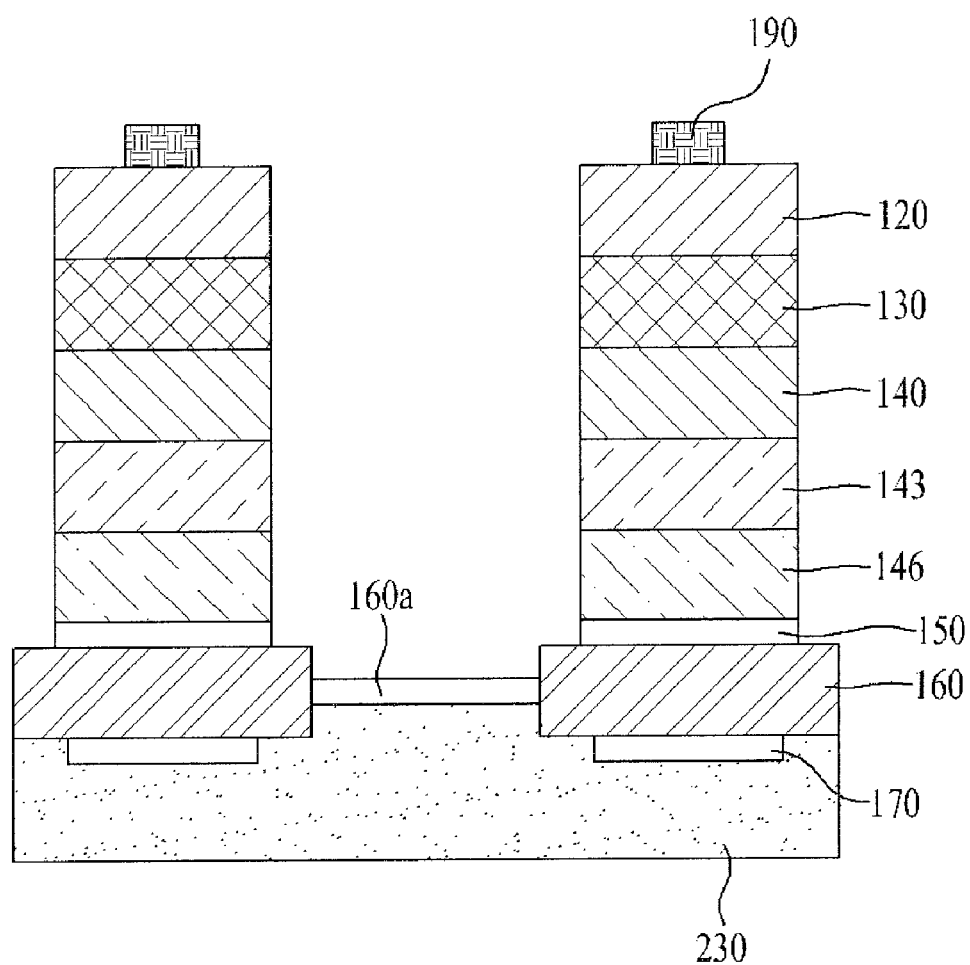
FIGS. 1 and 2 are diagrams illustrating a light emitting device and a light emitting device array according to an embodiment of the embodiment.

Reference will now be made in detail to the specific embodiments of the embodiment, examples of which are illustrated in the accompanying drawings. Wherever possible, the same reference numbers will be used throughout the drawings to refer to the same or like parts.

As follows, exemplary embodiments of the embodiment capable of embodying the object of the embodiment will be described in reference to the accompanying drawings.

If it is disclosed in description of the embodiments that each of layers (films), regions, patterns and structures is formed "on" or "under" a substrate, each of corresponding layers (film), regions, pads or patterns, the expression of "on" and "under" may include "directly formed on and under" and "indirectly formed on and under, with another layer disposed there between". "On" and "under" of each of the layers will be described by a standard of the accompanying drawings.

The thickness and size of each layer may be exaggerated, emitted or illustrated schematically in the drawings, for explanation and precision. The size of each component shown in the drawings may not reflect the actual size completely.

Figure 2:
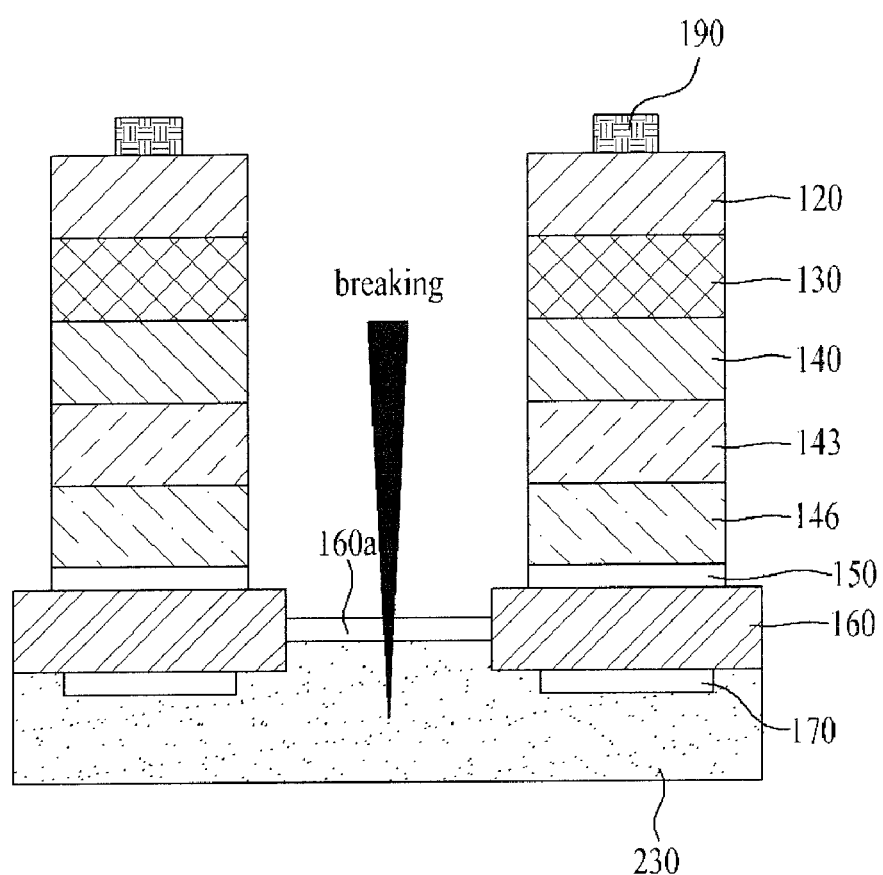

FIGS. 1 and 2 are diagrams illustrating a light emitting device and a light emitting device array according to an embodiment of the embodiment. As follows, the light emitting device and the light emitting device array according to the embodiment will be described in reference to FIGS. 1 and 2.

Each of light emitting devices is bonded on a first supporting member of a light emitting device array according to the embodiment via a bonding layer 170. The first supporting member may be a base sheet 230 and the base sheet 230 may support the light emitting device array.

The base sheet 230 may have an UV tape shape or Si-treated tape shape and it has thermal stability which is good enough to resist a laser scribe process. Epoxy resin having an adhesive property may be mixed with one of PVC, PAT and PPT to form the base sheet 230.

A second supporting member of a light emitting device may is connected with a second supporting member of another light emitting device via a metal layer 160a and the metal layer fixes sides of the second supporting members.

The second supporting member may be a conductivity supporting substrate 160. The metal layer 160a which will be described later may be melted by a laser and re-solidified after that. In addition, two light emitting devices are connected in parallel in FIG. 2 and three and more light emitting devices may be connected via the metal layer 160a in parallel.

The bonding layer 170 may be formed inner 1~10 micrometer than an edge of a light emitting structure. The width of the bonding layer 170 may be patterned narrower than that of the light emitting device. The wide of the light emitting device means the wide of the light emitting structure. In addition, it is not necessary to form the bonding layer 170 in the same shape as the light emitting structure and the bonding layer 170 may be formed in a circular, or rectangular shape or the other polygonal shapes only if it can fix the conductivity supporting substrate 160 to the base sheet 230 which will be described in detail later.

According to a micro-structure of the bonding layer 170, a micro-concave-convex structure may be formed on a surface of the bonding layer and the thickness of the bonding layer 170 may not be uniform.

After the conductivity supporting substrates 160 are separated based on a device unit, the base sheet 230 may support the light emitting devices not to be separated from each other in a following process which will be described later.

The conductivity supporting substrate 160 may be employed as electrode. Because of that, predetermined metal having a good electrical conductivity may be used to form the conductivity supporting substrate 160. A predetermined metal having a high heat conductivity may be used to form the conductivity supporting substrate 160, because the conductivity supporting substrate 160 has to radiate heat generated during the operation of the device. The conductivity supporting substrate 160 may be formed of one material selected from a group of molybdenum (Mo), silicon (Si), tungsten (W), copper (Cu) and aluminum (Al) or it may be formed of an alloy of the group. The conductivity supporting substrate 160 may selectively include gold (Au), copper alloy (Cu Alloy), nickel (Ni), copper-tungsten (Cu—W), carrier wafer (for example, GaN, Si, Ge, GaAs, ZnO, SiGe, SiC, SiGe and $Ga_2O$). In addition, the conductivity supporting substrate 160 has to have an enough mechanical strength not to cause warpage of an overall nitride semiconductor and to separate the semiconductor as independent chip in a scribing process and a breaking process.

A reflective layer 146 and an ohmic layer 143 may be formed on the conductivity supporting substrate 160. To bond the reflective layer 146 with the conductivity supporting substrate 160, the reflective layer 146 may perform a function of an adhesion layer or an auxiliary adhesion layer 150 may be formed. The adhesion layer 150 may be formed of a predetermined material selected from a group configured of gold (Au), tin (Sn), indium (In), aluminum (Al), silicon (Si), silver (Ag), nickel (Ni), platinum (Pt) and copper (Cu) or it may be formed of an alloy of the above materials.

The thickness of the reflective layer 146 may be approximately 2500 angstroms. The reflective layer 146 may be formed of a metal layer including aluminum (Al), silver (Ag), nickel (Ni), platinum (Pt), rhodium (Rh) or an alloy including Al, Ag, Pt or Rh. The aluminum, the silver or the like may reflect a light generated from an active layer 130 effectively, only to improve light extraction efficiency remarkably.

The thickness of the ohmic layer 143 may be approximately 200 angstroms. The ohmic layer may include at least one of ITO(indium tin oxide), IZO(indium zinc oxide), IZTO (indium zinc tin oxide), IAZO(indium aluminum zinc oxide), IGZO(indium gallium zinc oxide), IGTO(indium gallium tin oxide), AZO(aluminum zinc oxide), ATO(antimony tin oxide), GZO(gallium zinc oxide), IZON(IZO Nitride), AGZO(Al—Ga ZnO), IGZO(In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au and Hf, and the embodiment is not limited thereto.

A light emitting structure including a first conductivity type semiconductor layer 120, an active layer 130 and a second conductivity type semiconductor layer 140 may be formed on the ohmic layer 143.

The first conductivity type semiconductor layer 120 may be embodied by a 3-5 group compound semiconductor having a first conductivity type dopant doped thereon. If the first conductivity type semiconductor layer 120 is an n-type semiconductor layer, the first conductivity type dopant may include Si, Ge, Sn, Se and Te as n-type dopant and the embodiment is not limited thereto.

The first conductivity type semiconductor layer 120 may include a semiconductor material having an empirical formula: $Al_xIn_yGa(1-x-y)N$ ($0 \leq x \leq 1$, $0 \leq y \leq 1$, $0 \leq x+y \leq 1$). The first conductivity type semiconductor 120 may be formed of one or more of GaN, InN, AlN, InGaN, AlGaN, InAlGaN, AlInN, AlGaAs, InGaAs, AlInGaAs, GaP, AlGaP, InGaP, AlInGaP and InP.

The active layer 130 is a layer configured to emit a light having a predetermined energy determined by an unique energy band of an active layer (light emitting layer) after an electron injected via the first conductivity type semiconductor layer 120 meets a hole injected via the second conductivity type semiconductor layer 140 which will be formed later.

The active layer 130 may be formed in at least one of Single Quantum Well structure, Multi Quantum Well (MQW) structure, Quantum-Wire structure and Quantum Dot structure. For example, trimethylgallium gas (TMGa), ammonia gas ($NH_3$), nitrogen gas ($N_2$) and trimethylindium gas (TMIn) are injected to form the active layer 130 in MQW structure and the embodiment is not limited thereto.

A well layer/barrier layer structure of the active layer 130 may be formed of one or more of InGaN/GaN, InGaN/InGaN, GaN/AlGaN, InAlGaN/GaN, GaAs(InGaAs)/AlGaAs, GaP(InGaP)/AlGaP pair structures and the embodiment is not limited thereto. The well layer may be formed of material with a predetermined band gap lower than a band gap of the barrier layer.

A conductivity type clad layer (not shown) may be formed on and/or under the active layer 130. The conductivity type clad layer may be formed of AlGaN-group material and it may have a higher band gap than the band gap of the active layer 130.

The second conductivity type semiconductor layer 140 may include a 3-5 group compound semiconductor having a second conductivity type dopant doped thereon, for example, a semiconductor material having an empirical formula: $In_xAl_yGa1-x-yN$ ($0 \leq x \leq 1$, $0 \leq y \leq 1$, $0 \leq x+y \leq 1$). If the second conductivity type semiconductor layer 140 is a p-type semiconductor layer, the second conductivity type dopant may include Mg, Zn, Ca, Sr and Ba as p-type dopant.

This embodiment may present that the first conductivity type semiconductor layer 120 is a p-type semiconductor layer and that the second conductivity type semiconductor type layer 140 is an n-type semiconductor layer. On the second conductivity type semiconductor layer 140 may be formed a semiconductor layer having an opposite pole to a pole of the second conductivity type, for example, an n-type semiconductor layer (not shown) if the second conductivity type semiconductor layer is a p-type semiconductor layer. Because of that, the light emitting structure may be presented with one of N—P, N—P—N and P—N—P junction structures.

A first electrode 190 is formed on the first conductivity type semiconductor layer 120. The first electrode 190 is formed of one of molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of these metals.

When connected areas of the conductivity supporting substrates 160 disposed in the light emitting devices are removed as shown in FIG. 2, the conductivity supporting substrates 160 are separated to be independent devices.

The separated devices are subtly fixed to the base sheet 230 by the bonding layer 170 and they can be used as independent light emitting devices, respectively, after separated from the base sheet 230. The first electrode 190 of each separated light emitting device may be wire-bonded with a package body, to supply the electric power.

FIGS. 3 to 10 are diagrams illustrating a method for fabricating the light emitting device according to an embodiment. As follows, the method for fabricating the light emitting device will be described in reference to FIGS. 3 to 10.

Figure 3:
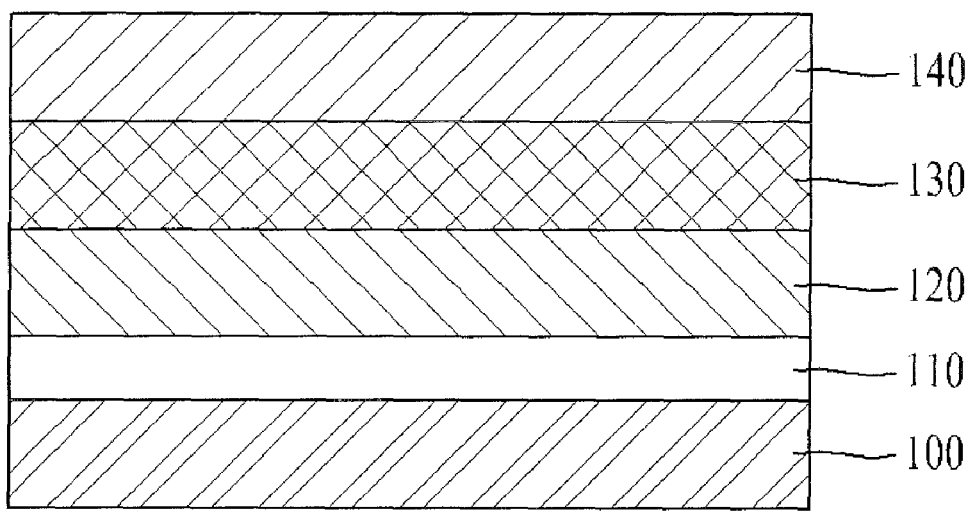
FIGS. 3 to 12 are diagrams illustrating a method for fabricating the light emitting device according to an embodiment of the embodiment.

First of all, as shown in FIG. 3, a light emitting structure including a buffer layer 110, a first conductivity type semiconductor layer 120, an active layer 130 and a second conductivity type semiconductor layer 140 may grow on a substrate 100.

The substrate 100 includes a conductivity substrate or dielectric substrate and it may use at least one of sapphire ($Al_2O_3$), SiC, Si, GaAs, GaN, ZnO, GaP, InP, Ge, and $Ga_2O_3$, for example. An uneven structure may be formed on the substrate 100 and the embodiment may not be limited thereto. Wet cleaning may be performed to the substrate 100 and impurities may be eliminated from a surface of the substrate 100.

The buffer layer 110 may grow between the light emitting structure and the substrate 100 and it is provided to reduce lattice mismatch and difference of thermal expansion coefficient. The buffer layer may be formed of a 3-5 group compound semiconductor, for example, at least one of GaN, InN, AlN, InGaN, AlGaN, InAlGaN and AlInN. An undoped semiconductor layer may be formed on the buffer layer and the embodiment may not be limited thereto.

The light emitting structure may grow according to a vapor deposition method such as MOCVD (Metal Organic Chemical Vapor Deposition), MBE (Molecular Beam Epitaxy) and HVPE (Hydride Vapor Phase Epitaxy).

Composition of the first conductivity type semiconductor layer 120 is same as the composition described above. According to the composition, an n-type GaN layer may be formed according to chemical vapor deposition (CVD), molecular beam epitaxy (MBE), sputtering or hydride vapor phase epitaxy (HVPE). Silane gas ($SiH_4$) including an n-type impurity such as trimethyl gallium gas (TMGa), ammonia gas ($NH_3$), nitrogen gas ($N_2$) and silicon (Si) is injected into a chamber to form the first conductivity type semiconductor layer 120.

The composition of the active layer 130 is same as the composition described above. For example, the trimethylgallium gas (TMGa), ammonia gas ($NH_3$), nitrogen gas ($N_2$) and trimethylindium gas (TMIn) are injected to form a multi-quantum well structure and the embodiment is not limited thereto.

The composition of the second conductivity type semiconductor layer 140 is same as the composition described above. Bis-ethylcycropentadienylmagnesium (EtCp2Mg){$Mg(C_2H_5C_5H_4)_2$} including a p-type impurity such as trimethylgallium gas (TMGa), ammonia gas (NH$_3$), nitrogen gas (N$_2$) and magnesium (Mg) is injected into the chamber to form a p-type GaN layer and the embodiment is not limited thereto.

Figure 4:
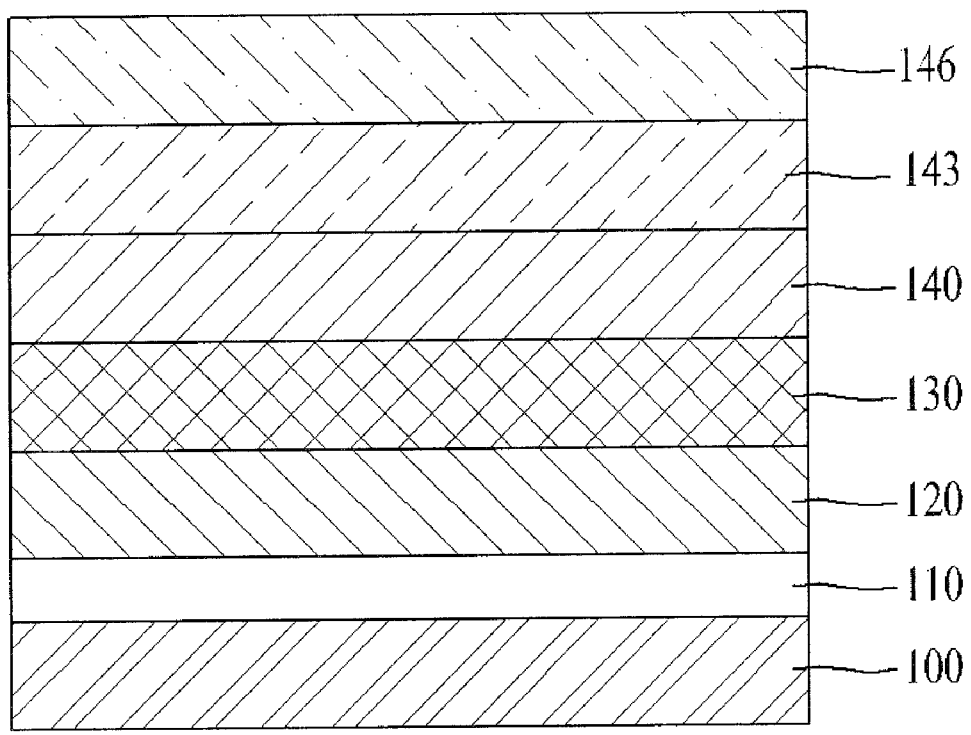

As shown in FIG. 4, the ohmic layer 143 and the reflective layer 146 are formed on the second conductivity type semiconductor layer 140. That is, the second conductivity type semiconductor layer 140 has a low impurity doping concentration and it has a high contact resistance accordingly, only to make an ohmic property not good. As a result, a transparent electrode may be formed on the second conductivity type semiconductor layer 140 as ohmic layer 143, to improve such an ohmic property.

The transparent electrode configured of a Ni/Au bilayer is commonly used and the Ni/Au bilayer transparent electrode forms ohmic contact, with increasing an electric current injection area, and it deteriorates a forward voltage (V$_f$).

In the meanwhile, a transparent conducting oxide (TCO) layer known to have a high transmissivity of approximately 90% or more may be formed as ohmic layer 143, instead of the Ni/Au bilayer having a low transmissivity of approximately 60% to 70%.

The ohmic layer 143 may include at least one of ITO (indium tin oxide), IZO(indium zinc oxide), IZTO(indium zinc tin oxide), IAZO(indium aluminum zinc oxide), IGZO (indium gallium zinc oxide), IGTO(indium gallium tin oxide), AZO(aluminum zinc oxide), ATO(antimony tin oxide), GZO(gallium zinc oxide), IZON(IZO Nitride), AGZO(Al—Ga ZnO), IGZO(In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf and the embodiment is not limited to these materials. The ohmic layer 143 may be formed according to sputtering or electron beam vapor deposition. The thickness of the reflective layer 146 may be approximately 2500 angstroms. The reflective layer 146 may be formed of a metal layer including aluminum (Al), silver (Ag), nickel (Ni), platinum (Pt), rhodium (Rh) or an alloy having Al, Ag or Pt. The aluminum and silver may reflect a light generated from the active layer 124 effectively and light extraction efficiency of the light emitting device may be improved remarkably.

Figure 5:
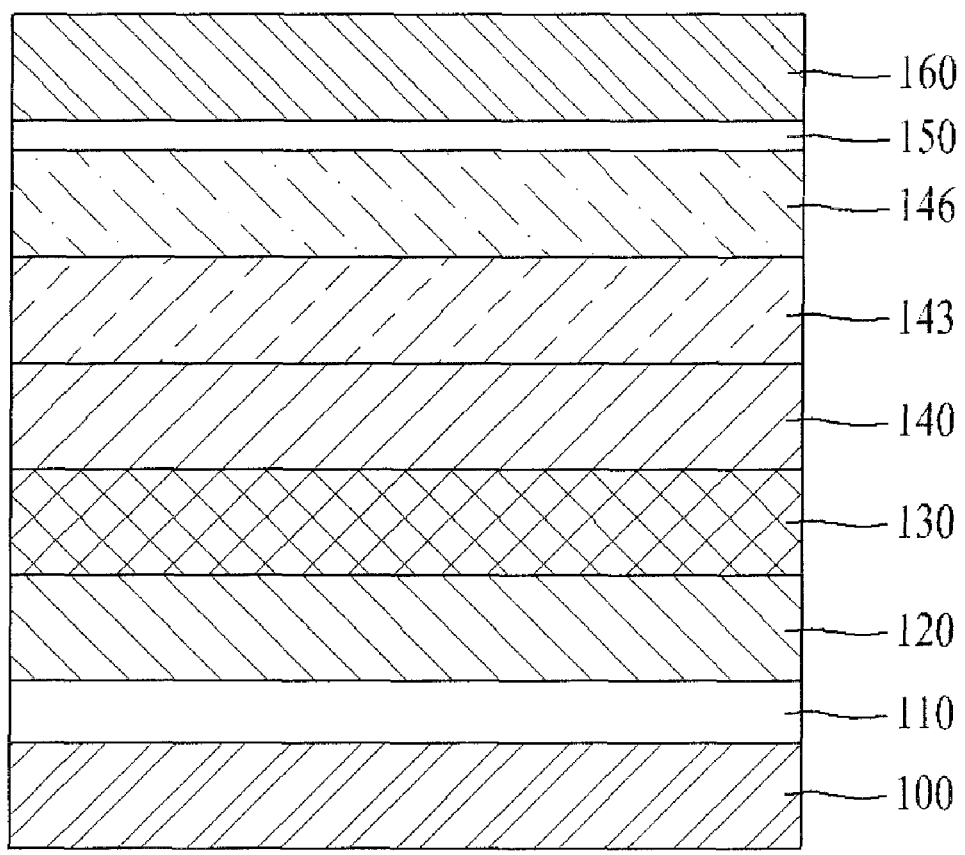

As shown in FIG. 5, the conductivity supporting substrate 160 may be formed on the reflective layer 146.

The composition of the conductivity supporting substrate 160 may be same as the composition described above. The conductivity supporting substrate 160 may be formed according to an electro-chemical metal deposition or bonding which uses a eutectic metal. To bond the reflective layer 146 with the conductivity supporting substrate 160, the reflective layer 146 may be employed as adhesion layer. Alternatively, an adhesion layer 150 may be formed of a selected material from a group configured of gold (Au), tin (Sn), Indium (In), aluminum (Al), silicon (Si), silver (Ag), nickel (Ni) and copper (Cu) or the adhesion layer 150 may be formed of an alloy of these materials.

A crystal structure and a crystal lattice constant of the conductivity supporting substrate 160 may be similar to corresponding ones of a soft metal having a good heat conductivity and the above metals. Because of that, the least internal tension may be generated during an alloying process and a mechanical strength may be enlarged.

Figure 6:
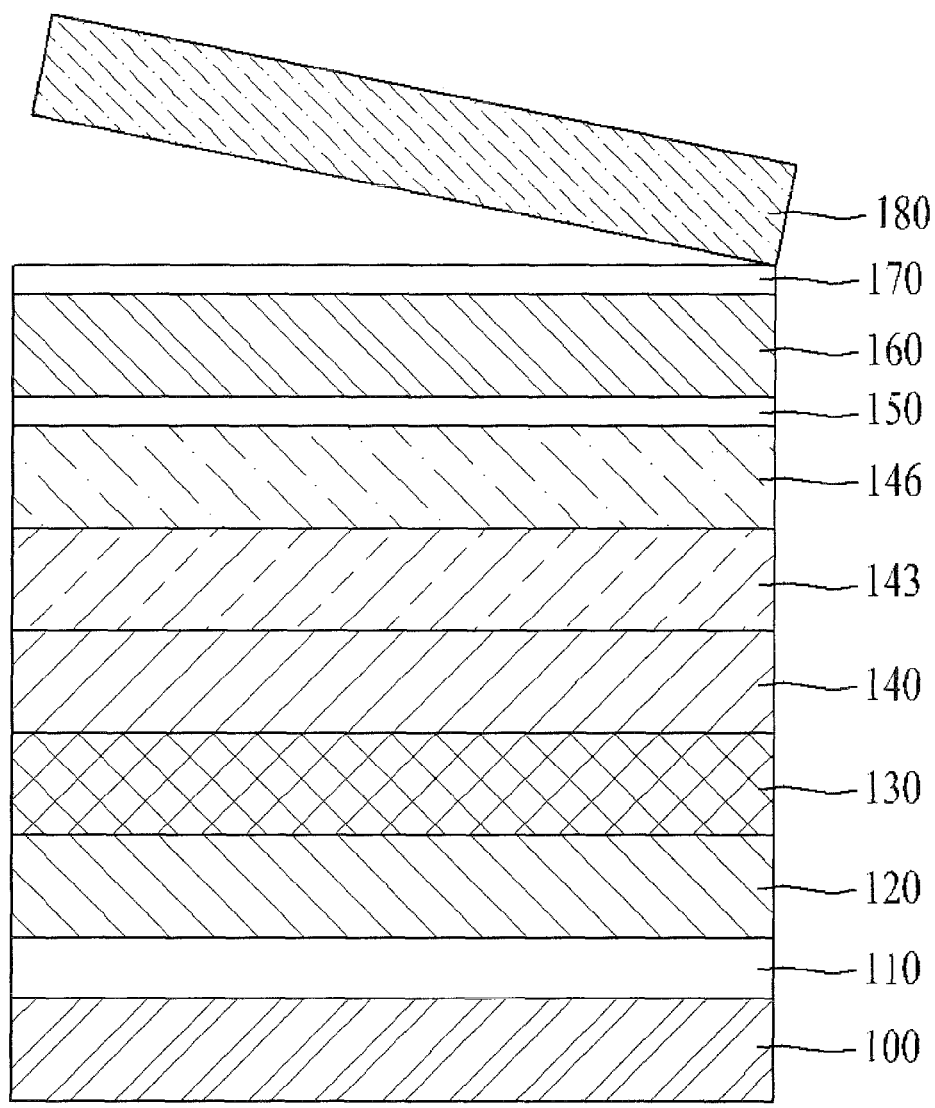

As shown in FIG. 6, a bonding layer 170 and a dummy substrate 180 are formed on the conductivity supporting substrate 160. The dummy substrate 180 may be removed after the bonding layer 170 is formed as shown in the drawing.

The bonding layer 170 may be formed of a selected material from a group configured of Au, Sn, Nb, Pb, In and Mo or an alloy of these materials. The width of the bonding layer 170 may be patterned narrower than the width of the light emitting device. At this time, the width of the light emitting device means the width of the light emitting structure.

The bonding layer 170 is not necessarily formed in the same appearance as nitride semiconductor device and it may be formed in a circular, rectangular or the other polygonal shape only if it can fix the conductivity supporting substrate 160 to the base sheet which will be described.

At this time, the patterning of the bonding layer 170 may be performing by covering a mask on the material of the bonding layer 170 and etching the mask. The patterned region of the bonding layer 170 may be narrower 1~10 micrometers with respect to both edges of the light emitting structure corresponding to the light emitting device. If the width of the bonding layer 170 is too large, burr will be generated and absorbed when the light emitting structure is separated in a laser scribing process. In contrast, if the width of the bonding layer 170 is too small, the bonding of the light emitting structures will not be accomplished enough.

The bonding layer 170 may be patterned after the dummy substrate 180 is eliminated, as shown in the drawing. Alternatively, the bonding layer 170 may be patterned by using a mask, with the width described above, when it is deposited.

Less burr may be generated in sides of the bonding layer 170 formed smaller than the conductivity supporting substrate 160 in the above process. Because of that, the light emitting property may be improved. In addition, detachment of the bonding material may be reduced, compared with the conventional bonding which uses silver (Ag) group bonding material.

Figure 7:
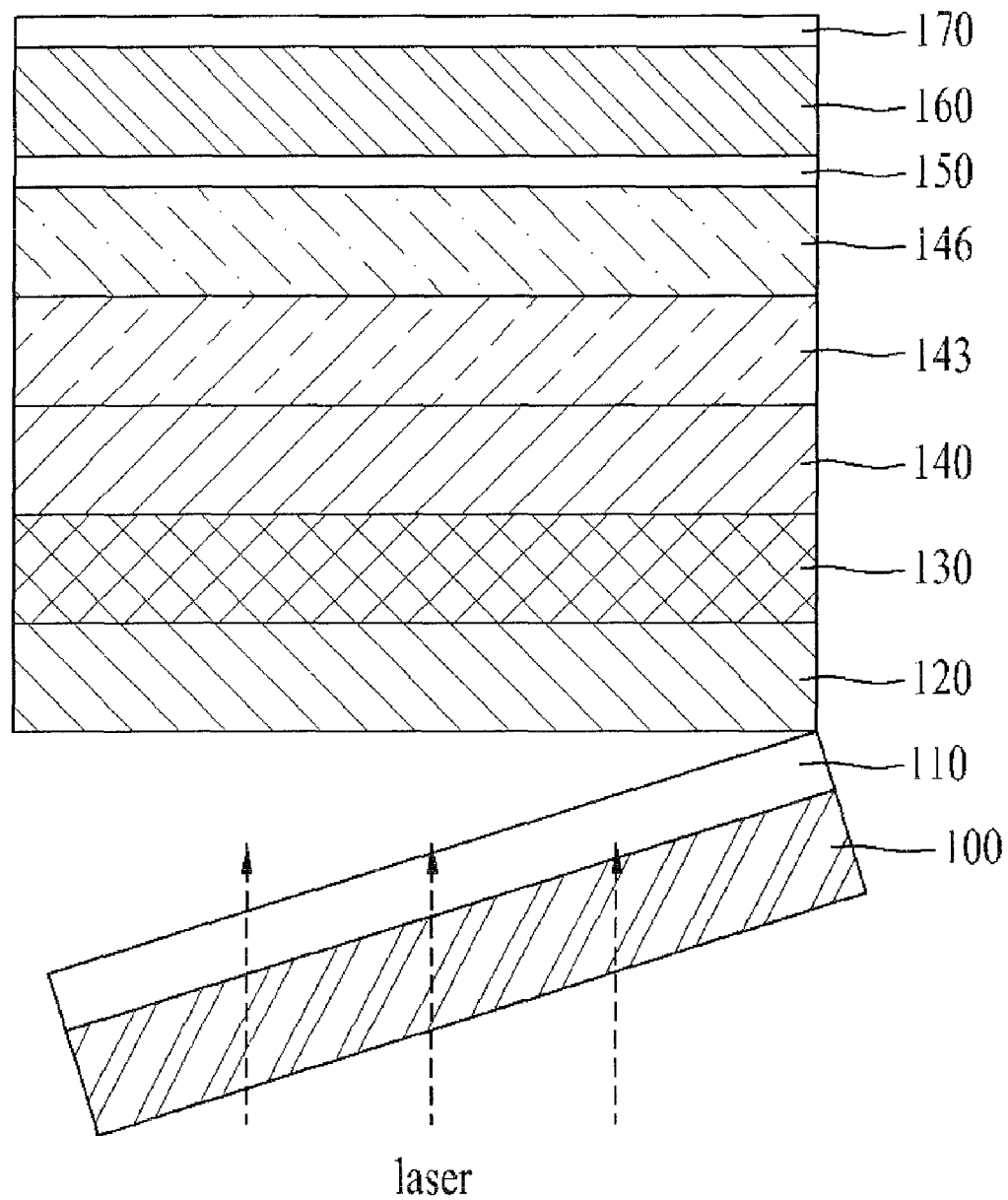

Hence, the substrate 100 is separated from the first conductivity semiconductor layer 120 as shown in FIG. 7. Removal of the substrate 100 may be performed according to Laser Lift Off (LLO), Dry and Wet Etch.

Especially, the removal of the substrate 100 may be performed according to Laser Lift Off (LLO). An excimer laser beam having a predetermined wavelength is focused on a predetermined region of the substrate 100 and the beam is irritated. If then, a thermal energy is concentrated on a border surface between the substrate 100 and the first conductivity type semiconductor layer 120. Because of that, an interface of the first conductivity type semiconductor layer 120 is divided into gallium and nitride molecules. At the same time, the separation of the substrate 100 momentarily occurs at a region where the laser beam passes. Here, the buffer layer 110 may be separated together with the substrate 100.

Figure 8:
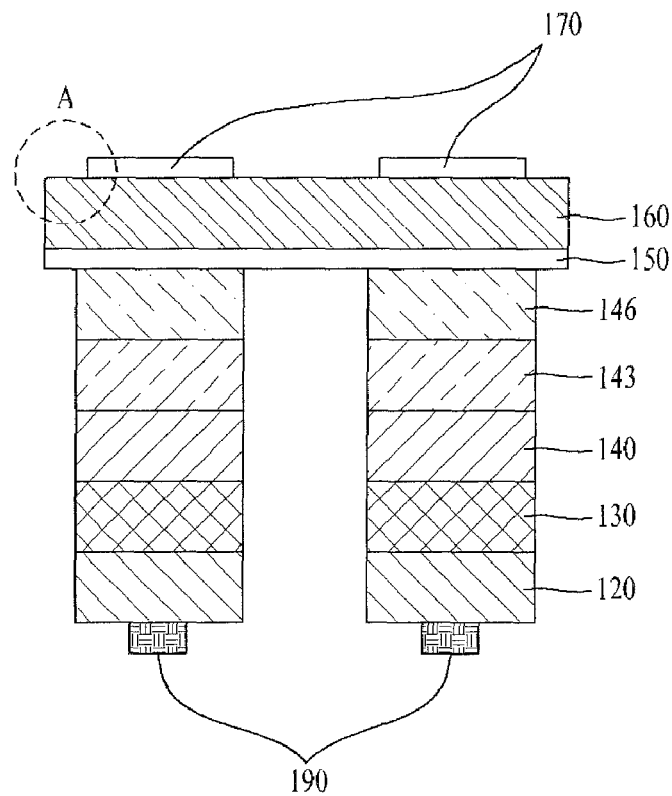
Figure 9:
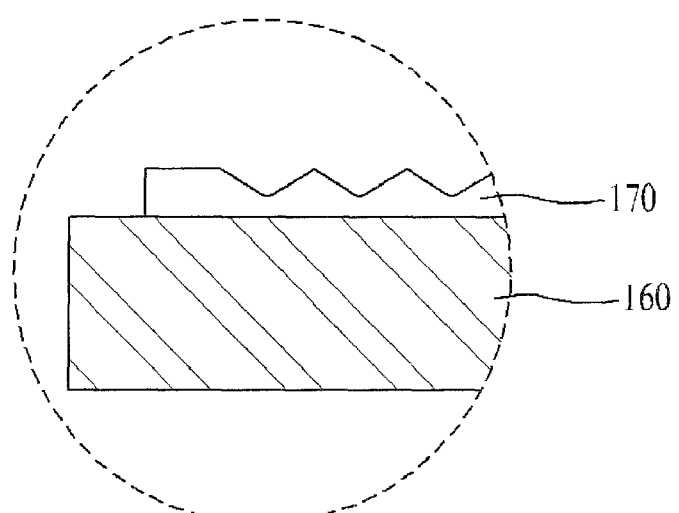

After that, as shown in FIG. 8, the light emitting structures are diced into device units. The first electrode 190 is formed on the first conductivity type semiconductor layer 120 of each separated light emitting structure. The first electrode 190 acts as n-type electrode and it includes at least one of aluminum (Al), titanium (Ti), chromium (Cr), nickel (Ni), copper (Cu) and gold (Au), with a unilayer or multilayer structure. According to FIG. 8, the width of the bonding layer 170 is patterned narrower than that of the light emitting structure. FIG. 9 is an enlarged view of 'A' shown in FIG. 8. As shown in FIG. 9, the bonding layer 170 formed on the conductivity supporting substrate 160 is winding concave-convex structure. A surface of the bonding layer 170 may be soft concave-convex structure, not a sharp concave-convex structure as shown in the drawing. The concave-convex structure of the surface of the bonding layer 170 may be regular or irregular.

That is, it is enough for the thickness of the bonding layer 170 to be irregular, not regular. At this time, a surface area of the bonding layer 170 is increased and adhesion of the bonding layer 170 with the base sheet 230 may be improved in a process which will be described later.

Figure 10:
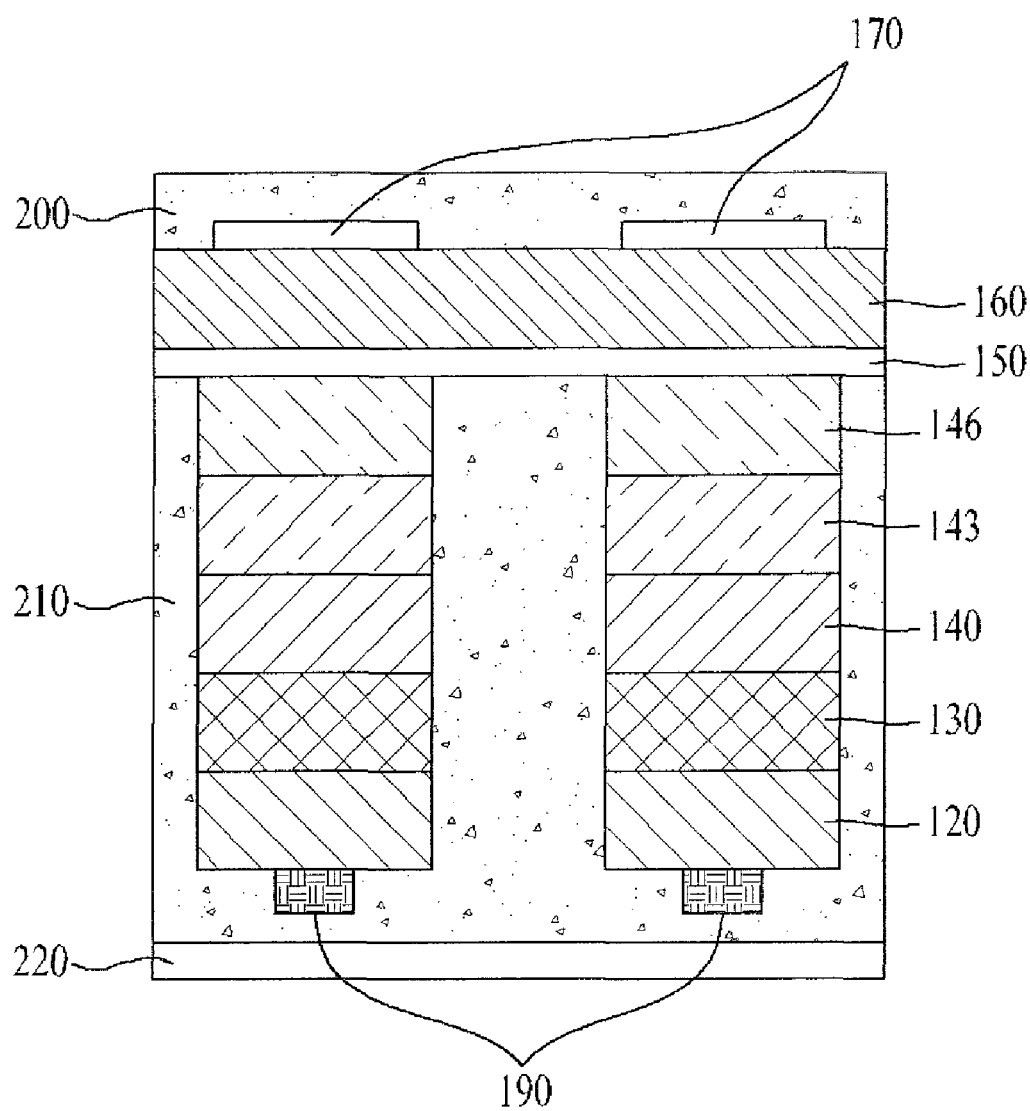

As shown in FIG. 10, a protection layer 200 is formed on the conductivity supporting substrate 160 having the bonding layer 170 formed thereon. At this time, a protection layer 210 may be formed on the nitride semiconductor having the first electrode 190 formed thereon. The protection layer 200 and 210 is employed to protect each of the light emitting devices in a chip-removing process which will be described later.

A base sheet 220 may be formed on the protection later 210. The base sheet 220 is employed to keep the light emitting devices not separated from each other after the conductivity supporting substrates 160 are divided into chip units in a process which will be described later.

Figure 11:
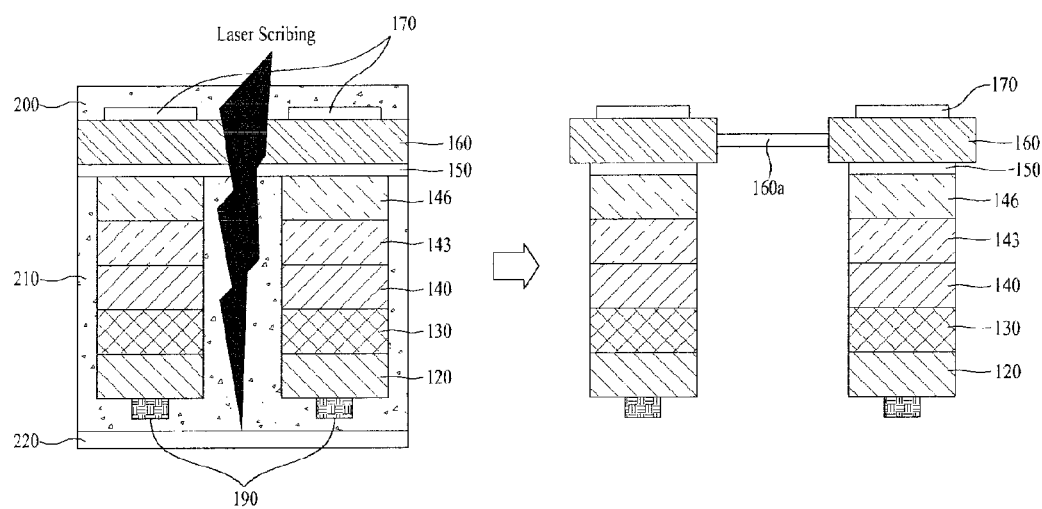

Hence, each of the light emitting devices is separated as shown in FIG. 11.

That is, the conductivity supporting substrate 160, the adhesion layer 150, the reflective layer 146 and the ohmic layer 143 may be separated according to the laser scribing method, corresponding to each of the light emitting structures.

A predetermined amount of melted metal after the laser scribing is re-solidified, to form the metal layer 160a which can connect the separated conductivity supporting substrates with each other. Alternatively, a predetermined part of the conductivity supporting substrate 160 remains in the laser scribing process to form the metal layer 160a. The metal layer 160a may include a predetermined part of the materials composing the bonding layer 170 and the light emitting structure in the re-solidification process. Although not shown in the drawing, material of a passivation layer formed in an edge of each light emitting structure may be included in the metal layer 160a.

Figure 12:
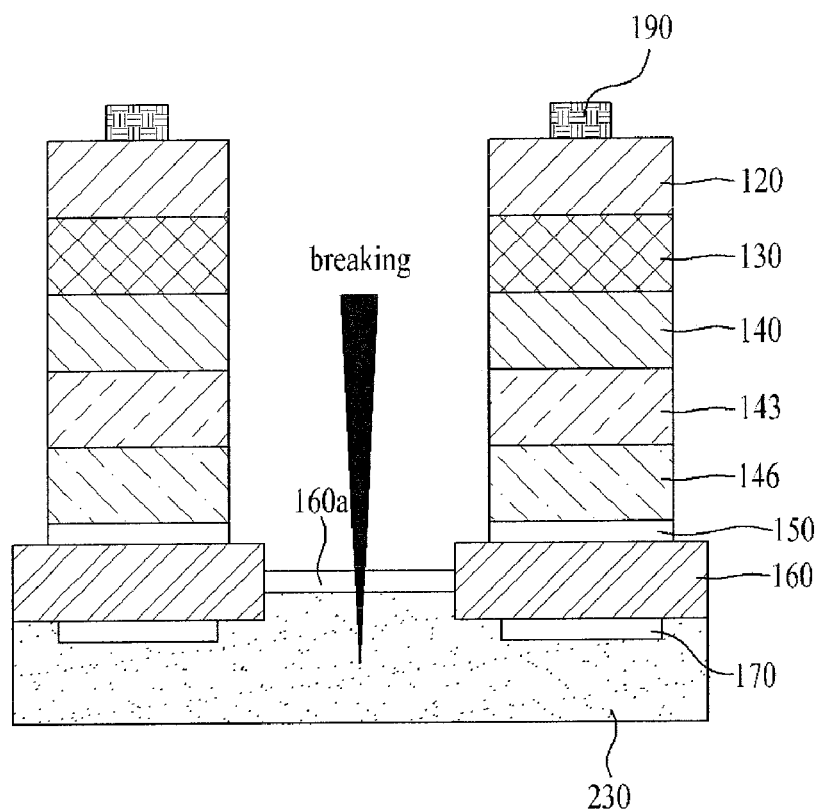

As shown in FIG. 12, the light emitting devices are bonded on the base sheet 230. At this time, each of the light emitting device is fixed on the base sheet 230, with the bonding layer 170 bonded with the base sheet 230. The base sheet 230 is same as the base sheet 220 shown in FIG. 10, with different positions supporting the light emitting devices.

As shown in the drawing, a bottom surface of each light emitting device is fixed to the base sheet 230 via the bonding sheet 170. The sides of the conductivity supporting substrates 160 of the light emitting devices are fixed via the re-solidified metal layer 160a.

As shown in FIG. 12, the metal layers 160a connecting the light emitting devices with each other are removed to separate each of the light emitting devices. Here, a protection layer (not shown) may be formed on the light emitting devices before the removing process.

The light emitting device array formed in the above process includes the plurality of the light emitting devices fixed on the base sheet 230 via the bonding layer 170. Each of the light emitting devices separated to be device units are fixed to the base sheet 230 by the bonding layer 170 and it may be separated from the base sheet 230 to be used as independent light emitting device.

The first electrode 190 of the light emitting device separated from the base sheet 230 may be wire-bonded with the package body and the light emitting device package may be fabricated.

During the process, a part of the bonding layer under the dummy substrate 180 is removed. Because of that, metal burr may not be generated in the laser scribing process such that the chip property may be precise and that die/wire-bonding may be performed smoothly in a package process. Also, the surface of the bonding layer 170 forms the concave-convex structure to improve the adhesion of the devices. Au, Sn, Nb, Pb, In and Mo are used as bonding materials and detachment of the bonding material may be reduced, compared with the conventional bonding which uses Ag-group bonding material.

Figure 13:
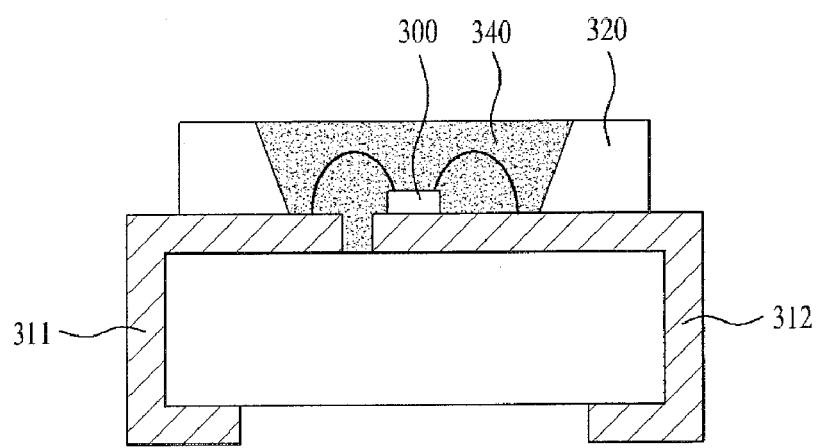
FIG. 13 is a diagram illustrating a light emitting device package according to an embodiment of the embodiment.

FIG. 13 is a sectional view illustrating a light emitting device package according to an embodiment. As follows, the light emitting device package according to the embodiment will be described in reference to FIG. 13.

As shown in FIG. 13, the light emitting device package according to this embodiment includes a package body 320, first and second electrodes 311 and 312 installed in the package body 320, a light emitting device 300 installed in the package body 320, with being electrically connected with the first and second electrodes 311 and 312, and a filling material 340 surrounding the light emitting device 300.

The package body 320 includes silicon, synthetic material or metal. A slope is formed adjacent to the light emitting device 300 and light extraction efficiency may be enhanced.

The first electrode 311 and the second electrode 312 are separated electrically from each other, and they provide the light emitting device 300 with an electric voltage. In addition, the first and second electrodes 311 and 312 reflect a light generated from the light emitting device 300, to improve light efficiency, and they may exhaust the heat generated from the light emitting device 300 outside.

The light emitting device 300 may be installed on the package body 320 or either of the first electrode 311 and the second electrode 312. The metal layer 160a connecting the light emitting devices each other may be removed from the light emitting device array shown in FIG. 1 and the light emitting device 300 is separated from the base sheet 230. After that, the light emitting device 300 may be fixed to the package body 320 via the bonding layer 170.

The light emitting device 300 may be electrically connected with the first and second electrodes 311 and 312 by at least one of wire-bonding, flip chip-bonding or die-bonding.

The filling material 340 surrounds the light emitting device 300 to protect the light emitting device 300. A phosphor is provided in the filling material 340 and a wavelength of a light emitted from the light emitting device may be changed.

At least one of the light emitting devices according to the embodiments described above may be mounted on the light emitting device package one by one or in plural, and the embodiment is not limited thereto. When the plurality of the light emitting devices is mounted on the single light emitting device package, the metal layer 160a connecting the conductivity supporting substrate of each light emitting device is removed.

The plurality of the light emitting device package according to the embodiment may be arrayed on the substrate and a light guide plate, a prism sheet and a diffusion sheet, which are optical elements, may be arranged on a light passage of the light emitting device package. Such the light emitting device package, the substrate and the optical elements may be functioned as light unit. Another embodiment of the embodiment may present a display device, a pointing device and a lightening system which include the semiconductor light emitting device or light emitting device package disclosed in the embodiments described above. For example, the lightening system may include a lamp and a streetlamp.

Figure 14:
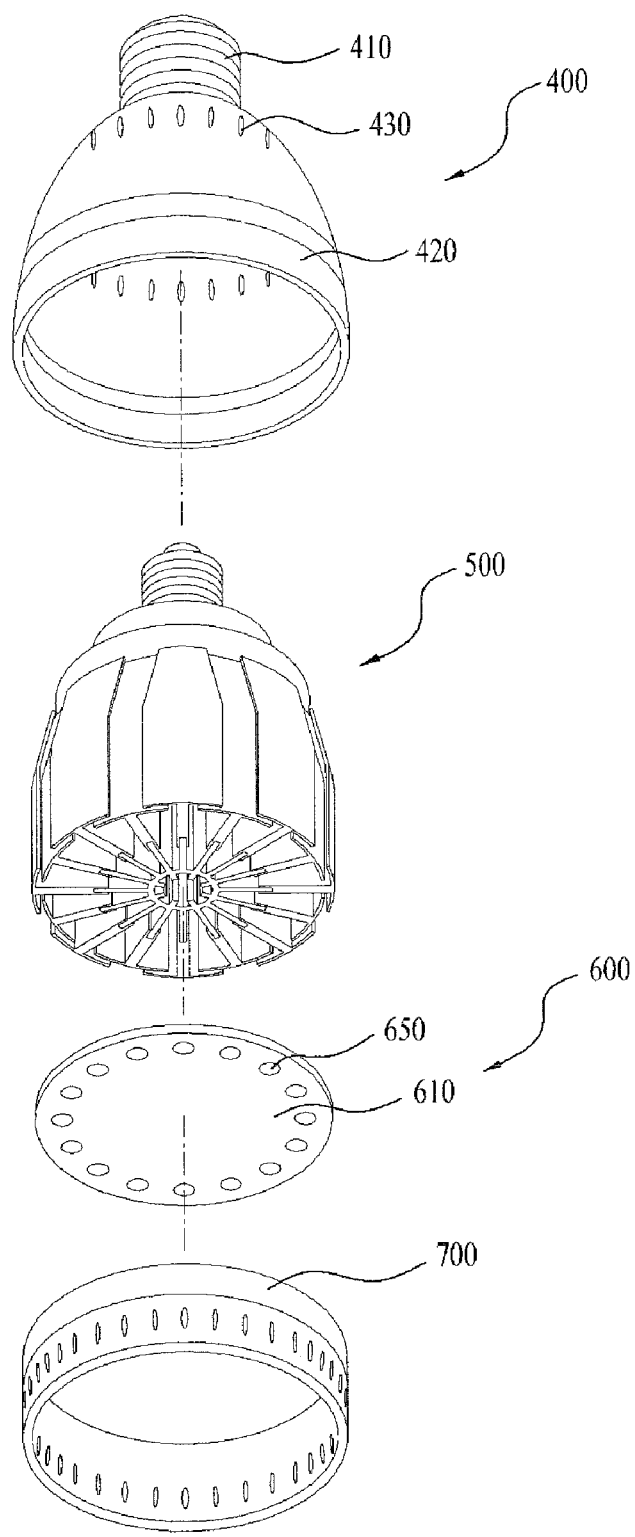
FIG. 14 is an exploded perspective view illustrating a lightening device including the light emitting device package according to an embodiment of the embodiment.

FIG. 14 is an exploded perspective view illustrating a lightening device according to an embodiment, with the light emitting device package.

The lightening device according to this embodiment includes a light source 600 configured to project a light, a housing 400 where the light source 600 is mounted, a heat radiating part 500 configured to radiate heat of the light source 600, and a holder 700 configured to connect the light source 600 and the heat radiating part 500 with the housing 400.

The housing 400 includes a socket-secured part 410 secured to an electric socket (not shown) and a body part 420 connected with the socket-secured part 410, with the light source 600 mounted therein. A single air hole 430 may be formed through the body part 420.

The plurality of the air holes 430 may be formed in the body part 420 of the housing 400. The air hole 430 may be a single hole or the plurality of the air holes may be arranged in a radial direction. Here, various arrangements of the plurality of the air holes may be possible, rather than the radial arrangement.

The light source 600 includes a substrate 610 and a plurality of light emitting packages 650 arranged on the substrate 610. The substrate 610 may have a predetermined shape to be inserted in an opening of the housing 400 and it may be formed of a material having a high thermal conductivity to transmit heat to the heat radiating part 500.

The holder 700 may be provided under the light source and it may include a frame and another air hole. Although not shown in the drawing, optical elements may be provided under the light source 600 and lights emitted from the light emitting device package 650 may be diffused, scattered or collected.

Brightness of the lightening device according to this embodiment may be increased, because the lightening device uses the light emitting device package with improved light output.

Figure 15:
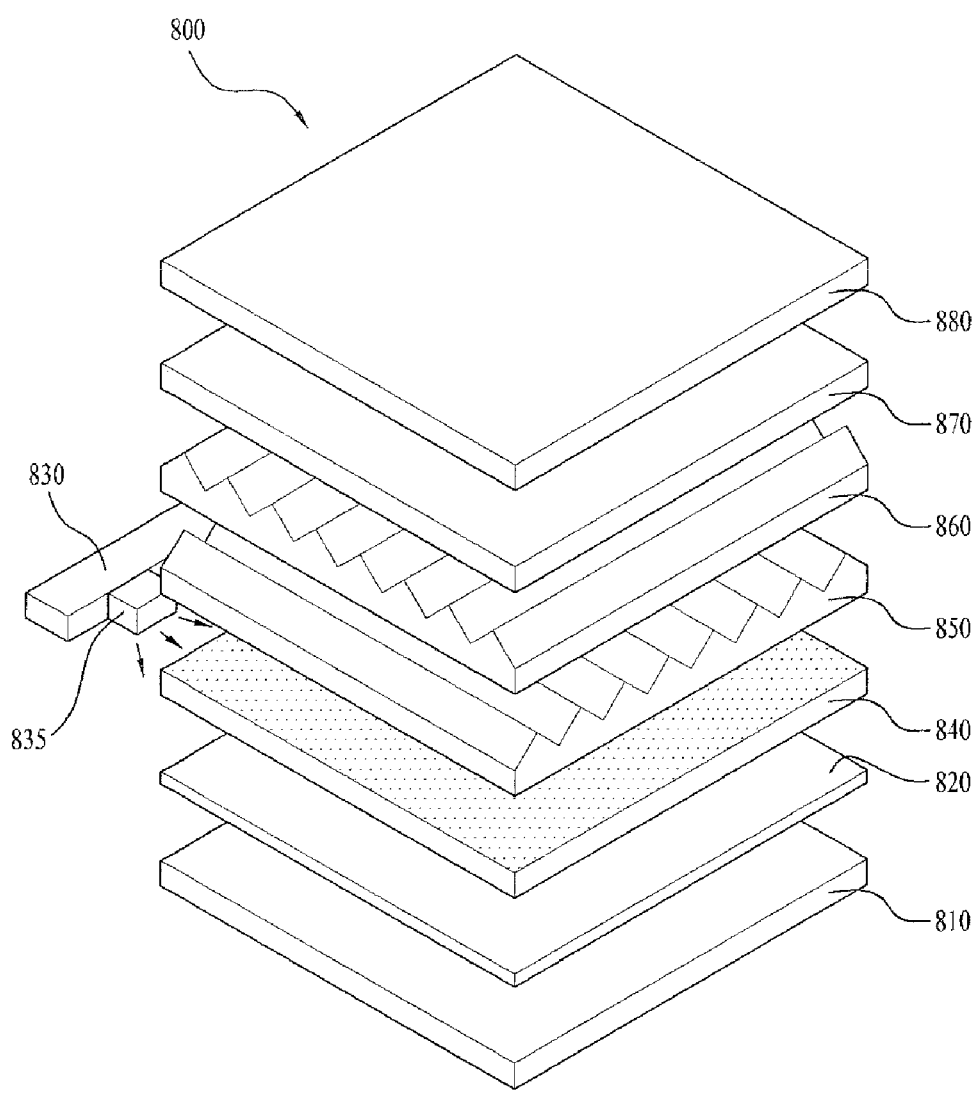
FIG. 15 is a diagram illustrating a display device including the light emitting device package.

FIG. 15 is a diagram illustrating a backlight including the light emitting device package.

As shown in FIG. 15, a display device 800 according to an embodiment includes light emitting modules 830 and 835, a reflective plate 820 disposed on a bottom cover 810, a light guide plate 840 arranged on a front of the reflective plate 820 to guide a light emitted from the light emitting modules forwardly, first and second prism sheets 850 and 860 arranged on a front of the light guide plate 840, a panel 870 arranged on a front of the second prism sheet 860, and a color filter 880 arranged on an overall area of the panel 870.

The light emitting module 830 includes a substrate 830 and a light emitting device package 835 disposed on the substrate 830. The substrate 830 may be a PCB and the light emitting device package 835 is described in reference to FIG. 13.

The bottom cover 810 may hold inner components of the display device 800. The reflective plate 820 may be an auxiliary component as shown in the drawing or the reflective sheep 820 formed of a material having high reflectivity may be coated on a front surface of the bottom cover 810.

The material which can be used into ultra-thin film type with a high reflectivity may be the reflective plate 820 and polyethylene terephtalate (PET) may be used as reflective plate 820.

The light guide plate 830 scatters the lights emitted from the light emitting device package to distribute the lights to an overall screen area of a liquid crystal display device uniformly. Because of that, the light guide plate 830 may be formed of a material having a good refractive index and transmissivity, for example, polymethylmethacrylate (PMMA), polycarbonate (PC) and polyethylene (PE).

The first prism sheet 850 is formed in a surface of a supporting film and it is formed of polymer having transparency and elasticity. The polymer may have prism layers having a plurality of space structures formed repeatedly. The plurality of the patterns may ribbed and grooved repeatedly in a stripe type, as shown in the drawing.

A direction of the ribbed and grooved shape formed in the surface of the supporting film disposed in the second prism sheet 860 may be perpendicular to a direction of the ribbed and grooved shape formed in the surface of the supporting film disposed in the first prism sheet 850. This is because the lights transmitted from the light emitting module and the reflective sheet have to be distributed in a forward direction of the panel 870 uniformly.

Although not shown in the drawing, a protection sheet may be disposed on each of the prism sheets and the protection sheet may include a light diffusive element and binder disposed on both surfaces of the supporting film. The prism layer may be formed of a polymer material selected from a group including polyurethane, butadiene-styrene copolymers, polyacrilate, Polymethacrylate, Polymethyl Methacrylate, polyethylene terephthalate elastomer, polyisoprene and polysilicon.

Although not shown in the drawing, a diffusion sheet may be arranged between the light guide plate 840 and the first prism sheet 850. The diffusion sheet may be formed of a polyester and polycarbonate group material and a light incident from a backlight unit is refracted and scattered, such that a light projection angle may be broadened as much as possible. The diffusion sheet includes a supporting layer having a light-diffusing agent and first and second layers formed in a light emitting surface (toward the first prism sheet) and a light incident surface (toward the reflective sheet), respectively, with no light-diffusing agent.

The supporting layer may include a siloxane-group light diffusing agent 0.1~10 weight part, having an average particle size in the range of 1~10 micrometers and an acryl-group light diffusing agent 0.1~10 weight, having an average particle size in the range of 1~10 micrometers, with respect to a resin part by 100 weight which is mixed with methacrylic acid-styrene copolymer and methyl methacrylate-styrene copolymer.

The first and second layers may include an ultraviolet ray absorbent 0.01~1 weight part and an antistic agent 0.0001~10 weight part, with respect to a methyl methacrylate-styrene copolymer resin 100 weight part.

The thickness of the supporting layer disposed in the diffusion sheet is 100~10000 micrometers and the thickness of each of the first and second layers is 10~1000 micrometers.

According to this embodiment, the diffusion sheet, the first prism sheet 850 and the second prism sheet 860 composes an optical sheet. The optical sheet may be configured of other compositions of a micro-lens array, a diffusion sheet and a micro-lens array or a single prism sheet and a micro-lens array, for example.

The panel 870 may be arranged on a liquid crystal display panel and other types of display devices requiring a light source may be provided, rather than the liquid crystal display panel.

In the panel 870, liquid crystal is located between glass bodies and a polarizer is lifted on the glass bodies to uses polarization of lights. The liquid crystal has an in-between property of liquid and solid. Liquid crystal which is an organic molecule is arranged regularly like crystal and a property of the molecule arrangement changed by an external field is used to display an image.

The liquid crystal panel used in the display device has an active matrix type which uses a transistor as switch adjusting a voltage supplied to each of pixels.

The color filter 880 is disposed on a front surface of the panel 870 and it transmits only red, green blue lights of the light projected from the panel 870 via pixels. Because of that, the image may be presented.

It will be apparent to those skilled in the art that various modifications and variations can be made in the embodiment without departing from the spirit or scope of the embodiments. Thus, it is intended that the embodiment covers the modifications and variations of this embodiment provided they come within the scope of the appended claims and their equivalents.

What is claimed is:

1. A light emitting device array comprising:
   a first supporting member;
   at least two bonding layers disposed on the first supporting member;
   a second supporting member disposed on each of the at least two bonding layers;
   a light emitting structure disposed on the second supporting member, the light emitting structure comprising a first conductivity type semiconductor layer, a second conductivity type semiconductor layer and an active layer disposed between the first conductivity type semiconductor layer and the second conductivity type semiconductor layer; and
   a first electrode disposed on the light emitting structure.

2. The light emitting device array of claim 1, wherein an edge of the bonding layer is located 1~10 micrometers inner than an edge of the light emitting structure.

3. The light emitting device array of claim 1, wherein the bonding layer comprises a concave-convex structure formed on a surface of the first supporting member.

4. The light emitting device array of claim 1, wherein the second supporting member of a light emitting device is connected with a second supporting member of a neighboring light emitting device via a metal layer.

5. The light emitting device array of claim 4, wherein composition of at least a portion of the metal layer is same as composition of the second supporting member.

6. The light emitting device array of claim 4, wherein composition of at least a portion of the metal layer is same as composition of the bonding layer.

7. The light emitting device array of claim 4, wherein composition of at least a portion of the metal layer is same as composition of the light emitting structure.

8. The light emitting device array of claim 1, further comprising:
   an ohmic layer disposed between the second conductivity type semiconductor layer and the second supporting member.

9. The light emitting device array of claim 8, further comprising:
   a reflective layer disposed between the ohmic layer and the second supporting member.

10. The light emitting device array of claim 9, further comprising:
    an adhesion layer disposed between the ohmic layer and the second supporting member.

11. The light emitting device array of claim 10, wherein the adhesion layer comprises at least one selected from a group consisting of Au, Sn, In, Al, Si, Ag, Ni and Cu or an alloy of the group.

12. The light emitting device array of claim 9, wherein the reflective layer comprises at least one of an alloy of Al, Ag, Pt and Rh, Al, Ag, Ni, Pt and Rh.

13. The light emitting device array of claim 8, wherein the ohmic layer comprises at least one selected from a group consisting of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf.

14. The light emitting device array of claim 1, wherein the second supporting member is a conductivity supporting substrate and the conductivity supporting substrate comprises at least one of a selected material from a group consisting of Mo, Si, W, Cu and Al or an alloy of the group, Au, Cu alloy, Ni-nickel, Cu—W and carrier wafer.

15. The light emitting device array of claim 1, wherein the first supporting member comprises one of PVC, PAT and PPT.

16. The light emitting device array of claim 15, wherein the first supporting member further comprises epoxy resin.

17. A light emitting device package comprising:
    a package body;
    a light emitting device disposed on the package body, the light emitting device comprising at least one bonding layer, a conductivity supporting substrate disposed on the at least one bonding layer and a light emitting structure disposed on the at least one conductivity supporting substrate, the light emitting structure comprising a second conductivity type semiconductor layer, an active layer and a first conductivity type semiconductor layer;
    first and second electrodes disposed on the package body, the first and second electrodes connected with the light emitting device; and
    a filling material configured to surround the light emitting device,
    wherein the conductivity supporting substrate of the light emitting device is connected with a conductivity supporting substrate of a neighboring light emitting device by a metal layer.

18. The light emitting device package of claim 17, wherein an edge of the bonding layer is located 1~10 micrometers inner than an edge of the light emitting structure.

19. The light emitting device package of claim 17, wherein the bonding layer comprises concave-convex structure formed on a surface of the package body.

* * * * *